United States Patent
Rivers et al.

(10) Patent No.: US 6,878,495 B1
(45) Date of Patent: Apr. 12, 2005

(54) PRODUCING AN IMAGE DATA TO BE USED BY A LASER THERMAL TRANSFER APPARATUS FOR USE IN MAKING COLOR EMISSIVE SITES

(75) Inventors: Andrea S. Rivers, Bloomfield, NY (US); Roger A. Braden, Rochester, NY (US); Michael L. Boroson, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/686,360

(22) Filed: Oct. 15, 2003

(51) Int. Cl.⁷ .............................. G03C 5/04; G03F 7/34
(52) U.S. Cl. ........................... 430/22; 430/30; 430/200
(58) Field of Search ............................. 430/22, 30, 200

(56) References Cited

U.S. PATENT DOCUMENTS

| | | | |
|---|---|---|---|
| 5,688,551 A | 11/1997 | Littman et al. | 430/200 |
| 6,682,863 B2 * | 1/2004 | Rivers et al. | 430/22 |
| 6,811,938 B2 * | 11/2004 | Tutt et al. | 430/22 |

* cited by examiner

*Primary Examiner*—Christopher G. Young
(74) *Attorney, Agent, or Firm*—Raymond L. Owens

(57) ABSTRACT

A method is described for producing image data to be used by a laser thermal transfer apparatus having a multiple channel printhead of laser beams for transferring different organic material with dopants from a donor onto on OLED substrate to form different color emissive sites on the substrate.

4 Claims, 6 Drawing Sheets

PRODUCING AN IMAGE DATA TO BE USED BY A LASER THERMAL TRANSFER APPARATUS FOR USE IN MAKING COLOR EMISSIVE SITES

CROSS REFERENCE TO RELATED APPLICATION

Reference is made to commonly assigned U.S. patent application Ser. No. 10/184,417 filed Jun. 27, 2002 by Rivers et al., entitled "Depositing an Emissive Layer for Use in an Organic Light-Emitting Display Device (OLED)", the disclosure of which is herein incorporated by reference.

FIELD OF THE INVENTION

The present invention relates to ways of controlling laser thermal transfer (LTT) apparatus, which causes the transfer of organic material from a donor element to a substrate causing the formation of color emissive sites within OLED devices.

BACKGROUND OF THE INVENTION

Organic light-emitting diodes (OLEDs) are useful in a variety of applications such as discrete light-emitting devices, or as the active element of light-emitting arrays or displays, such as flat-panel displays in watches, telephones, laptop computers, pagers, cellular phones, calculators, and the like.

Conventional OLED display structures are built on substrates in a manner such that a two-dimensional OLED array for image manifestation is formed. Each OLED in the array generally includes overlying layers starting with a light transmissive first electrode formed on the substrate, an organic electroluminescent (EL) emission medium deposited over the first electrode, and a metallic electrode on top of the organic electroluminescent medium. When an electrical potential is placed across the electrodes, holes and electrons are injected into the organic zones from the anode and cathode, respectively. Light emission results from hole-electron recombination within the device.

The EL layer within a color OLED display device most commonly includes three different types of fluorescent materials that are repeated through the EL. Red, green, and blue regions, or subpixels, are formed throughout the EL layer during the manufacturing process to provide a two-dimensional array of pixels. Each of the red, green, and blue subpixel sets undergoes a separate patterned deposition, for example, by evaporating a linear source through a shadow mask. Linear source vacuum deposition with shadow masking is a well known technology, yet it is limited in the precision of its deposition pattern and in the pattern's fill factor or aperture ratio; thus, incorporating shadow masking into a manufacturing scheme limits the achievable sharpness and resolution of the resultant display. Laser thermal transfer has the potential to deliver a more precise deposition pattern and higher aperture ratio; however, it has proved challenging to adapt laser thermal transfer to a high throughput manufacturing line, which is necessary to warrant its use in the manufacture of cost-effective OLED display devices.

One effective way for depositing color emissive sites is to use a laser thermal transfer apparatus. In this apparatus, a donor is provided which has organic material that can include a dopant having a specific fluorescent dye. An example of such an apparatus is set forth in U.S. Pat. No. 5,688,551 by Littman et al. The donor with the desired organic material is placed into close proximity to the OLED substrate within a vacuum chamber. A laser impinges through a clear (to the laser wavelength) support that provides physical integrity to the donor and is absorbed within a light-absorbing layer contained atop the support. The conversion of the laser's energy to heat sublimates the organic material that forms the top layer of the donor sheet and thereby transfers the organic material in a desired subpixel pattern to the OLED substrate.

A problem with using laser thermal transfer is that is subject to deterministic errors caused by the operation of the laser thermal transfer apparatus. One specific challenge in converting computer aided design (CAD) files produced by the display designer into instructions for a laser thermal transfer deposition system is to manage this process such that the system deposits an organic medium upon a substrate in such a way as to enable the manufacture of a high quality OLED display. For deposition to occur, CAD files must be converted through a raster image processor (RIP) into a form of instructions that the LTT printhead controller and motion control system can understand and follow. Design rule checking of the CAD is essential to guarantee that the design can be manufactured on the targeted equipment. Further, to get optimum performance from the LTT system, compensation for real world machine performance limitations is critical.

There is a need for a way to convert display design information into LTT machine control instructions in such that the manufacture of high quality OLED displays is assured.

SUMMARY OF THE INVENTION

It is therefore an object of the invention to provide an efficient way to provide an input to the laser thermal transfer apparatus to control such laser thermal transfer apparatus to compensate for errors introduced by such apparatus.

This object is achieved by a method for producing image data to be used by a laser thermal transfer apparatus having a multiple channel printhead of laser beams for transferring different organic material with dopants from a donor onto an OLED substrate to form different color emissive sites on the substrate, comprising:

a) receiving a graphical representation of the layout of the color emissive sites and alignment marks formed on the OLED substrate;

b) responding to such graphical representation and position of alignment marks to form coordinates to define the size and location of the color emissive sites on the OLED substrate relative to the alignment marks;

c) adjusting the coordinates of the color emissive sites to change the size and location of the color emissive sites to compensate for predetermined known errors that will be caused by the laser thermal transfer apparatus; and d) producing the image data to be used by the laser thermal transfer apparatus that includes positions for actuating the printhead with respect to the alignment marks and the sequence for actuation of selected printhead laser beams.

It is an advantage of the present invention that a CAD file containing a graphical representation of the layout of the color emissive sites and alignment marks formed on the OLED substrate can be adjusted with predetermined known error information to provide the image data for operating the laser thermal transfer apparatus.

DETAILED DESCRIPTION OF THE INVENTION

The present invention is a system for and a method of transferring a graphical representation of an image or deposition pattern, which can be conveniently represented as a CAD file to an LTT system for printing this image or deposition pattern. The system and method of the present invention includes various system steps in which data contained in CAD files is converted into a set of data structures used to govern the deposition of organic medium upon a substrate in order to subsequently form an OLED display. Utilization of these instructions during the laser thermal transfer process is described, to facilitate the understanding of the full production process. Kay et al. U.S. Pat. No. 6,582,875 describes the use of a multichannel laser printhead for the manufacture of OLED devices by thermal transfer. An apparatus such as that described by Kay et al. would be a suitable recipient of the set of data structures described herein.

Figure 1:
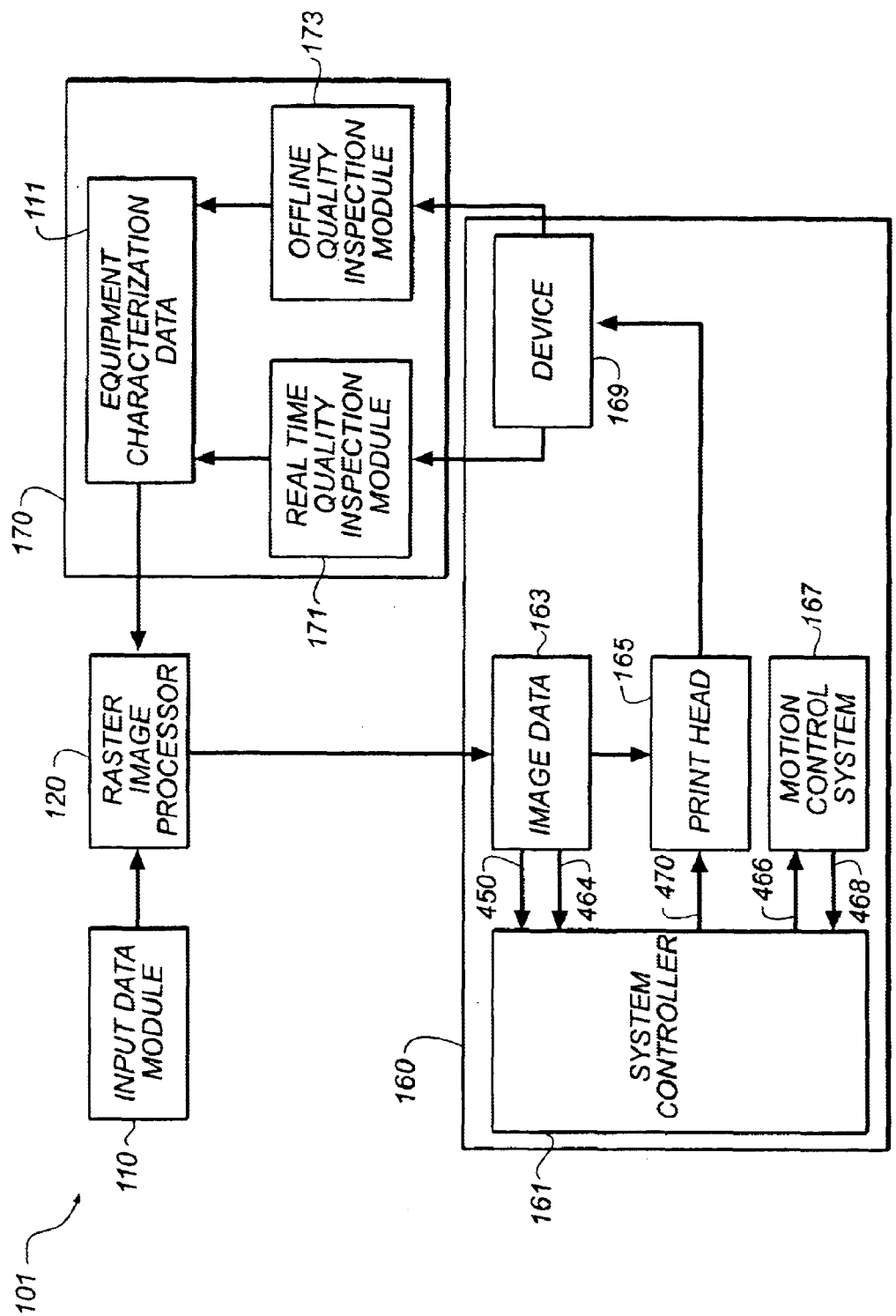
FIG. 1 illustrates a high-level block diagram of an LTT station for use in an OLED fabrication process.

FIG. 1 illustrates a high-level block diagram of an LTT station 101 for use in an OLED fabrication process. System 101 includes an input data module 110, which delivers data in the form of a CAD file to the raster image processor (RIP) 120. This CAD file data is combined in the RIP 120 with equipment characterization data 111 to generate image data 163, which is input to the laser thermal transfer apparatus 160. Within the laser thermal transfer apparatus 160, the system controller 161 coordinates the flow of image data 163 with the motion of the multichannel laser printhead 165 via actuation of the motion control system 167 to create device 169. The printhead 165 generates laser light in accordance with image data 163 to transfer organic material to the device 169 in a raster fashion. Each transit of the printhead 165 writes what is referred to as a swath 166 (not shown). Inspection of device 169 by a quality inspection module 170 enables update of the equipment characterization data 111. Either a real time quality inspection module 171 or an offline quality inspection module 173 can accomplish this inspection step.

Figure 2:
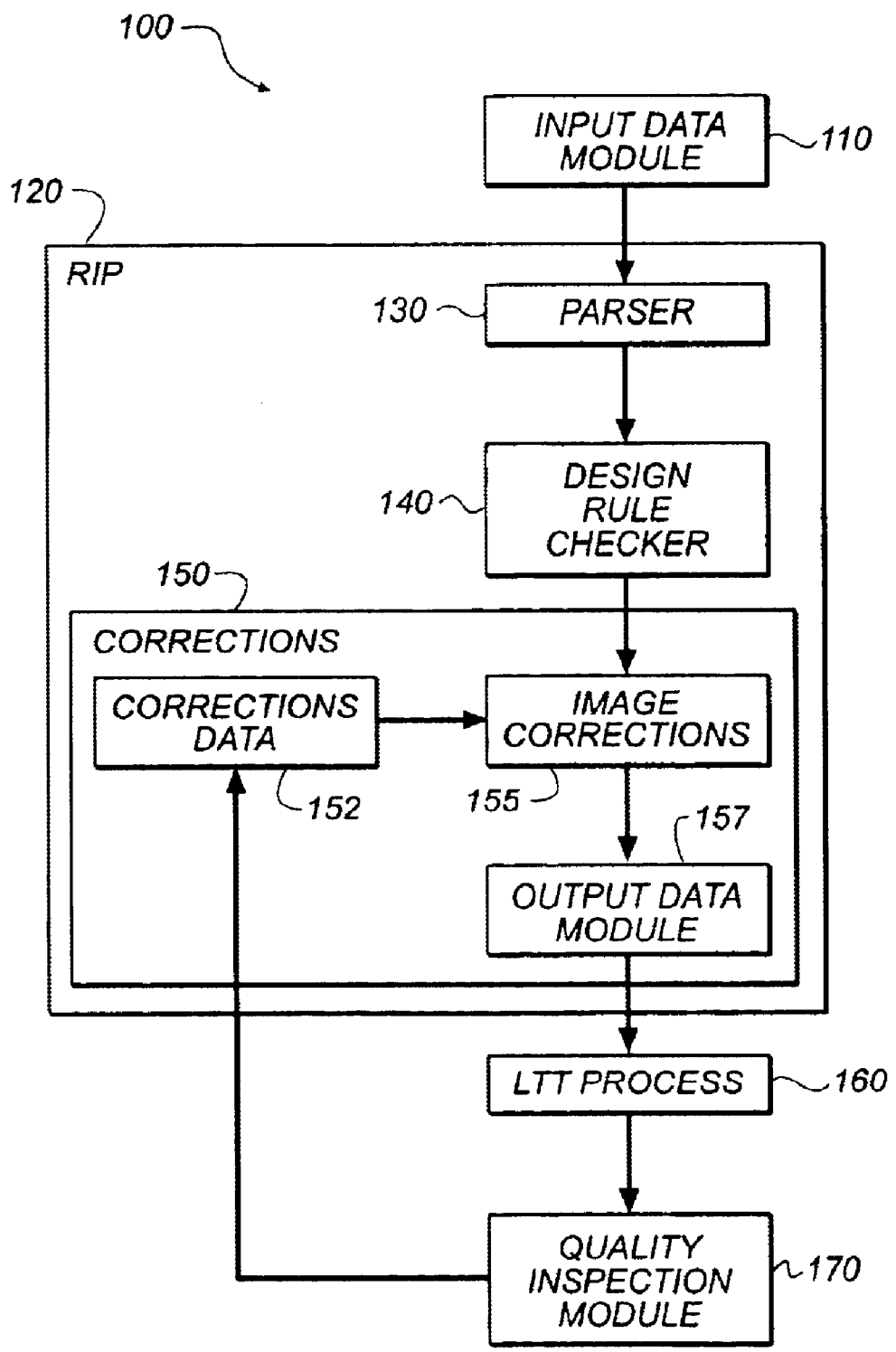
FIG. 2 shows a diagram of a method of converting a CAD file for use in a laser thermal transfer apparatus with the inclusion of feedback corrections concerning the capability of the laser thermal transfer apparatus via the quality inspection module.

FIG. 2 shows a diagram of a method of converting a CAD file for use in an LTT station 100. It is a detailed view of the RIP 120 process with the inclusion of feedback corrections concerning the capability of the laser thermal transfer apparatus 160 via the quality inspection module 170. The RIP 120 receives data from an input data module 10 and the quality inspection module 170. RIP 120 further includes a parser 130, a design rule checker 140, and a corrections module 150. Corrections module 150 contains a source of corrections data 152, an image corrections module 155, and an output data module 157. The output data module 157 delivers image data 163 to the laser thermal transfer apparatus 160.

A computer aided design (CAD) file that fully defines the mechanical coordinates of the required LTT deposition pattern is fed into RIP 120 of system 100 via input data module 110. A data set including fundamental machine characteristics is also fed into the RIP 120 of system 100 via input module 110. RIP 120 then uses both parser 130 and design rule checker 140 to convert the CAD file into a suitable data format that corrections module 150 can utilize. Parser 130 provides a conventional parsing function within RIP 120, breaking the CAD file down into parts that are managed by other operations within RIP 120. Design rule checker 140 inspects the parsed file and determines if the file fits certain pre-set parameters, as defined in the data set of fundamental machine characteristics, and applies predetermined design constraints to the RIP'd image file. The image correction module 155 receives input corrections data 152 provided by the specific LTT system that will be utilized to manufacture the OLED display and the parsed CAD file data. Output data module 157 contains the corrected image data, printhead, and motion control instructions such that the printing process pixel placement meets specification. The printhead and motion control components within the laser thermal transfer apparatus 160 receive deposition pattern instructions and deposit organic material upon a substrate, for the creation of OLED displays. In quality inspection module 170, OLED displays are inspected in order to quantify errors.

This disclosure concentrates solely on input data module 110, RIP 120, and image corrections module 155 of system 100 of FIG. 2.

Figure 3:
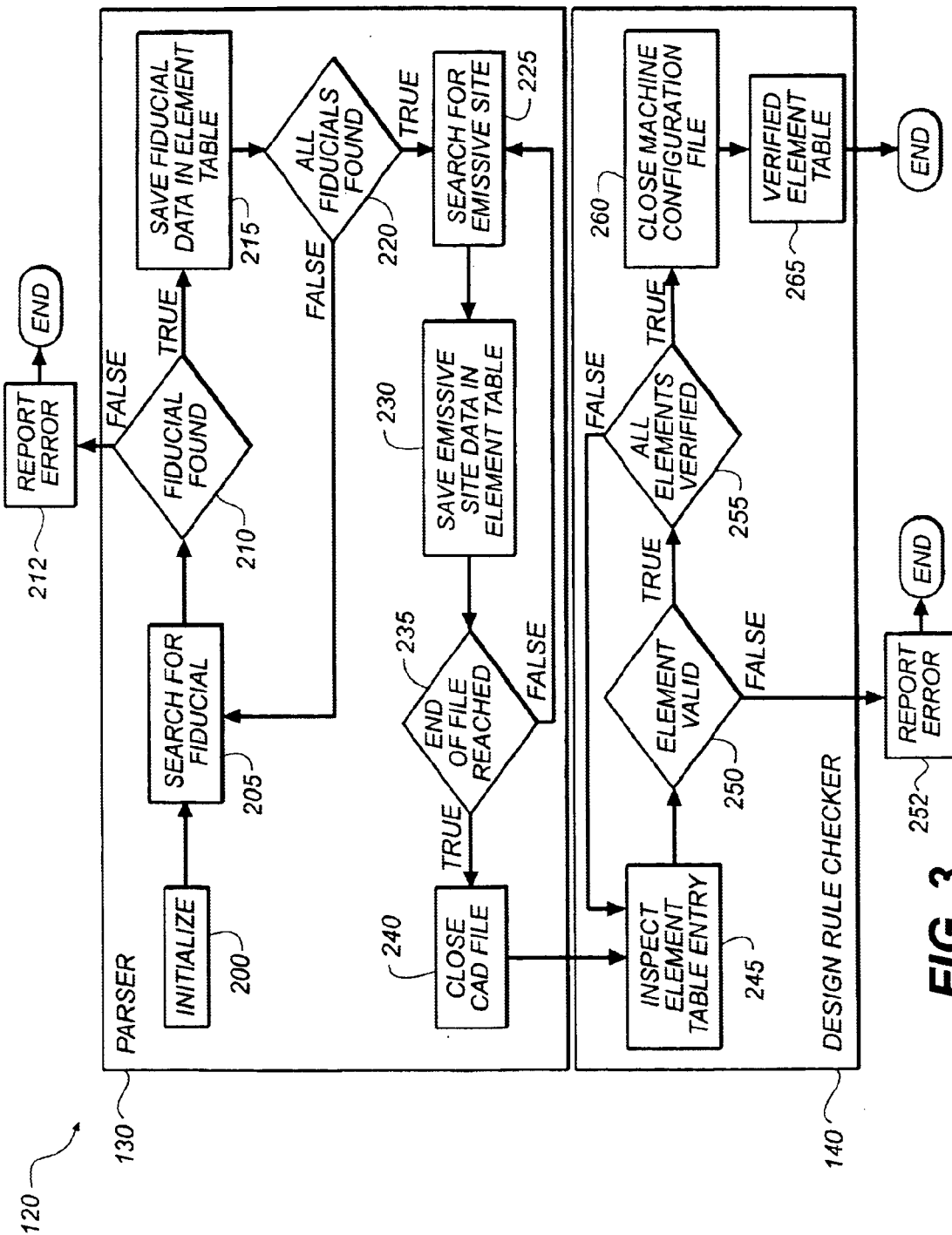
FIG. 3 shows the functionality of the first two operations within the raster image processor.

FIG. 3 shows the functionality of the parser 130 and the design rule checker 140 within RIP 120. Parser 130, beginning in Initialize 200, opens the CAD file, sets the element table to NULL and opens the machine configuration file. The CAD file contains the graphical representation of alignment marks in the form of fiducials for alignment and the relative placement of emissive sites for the OLED device that will be made. The machine configuration file contains all of the machine dependent parameters that need to be used by the design rule checker 140. The element table will be used to store fiducial and emissive site locations, dimensions, and other relevant data. Search for fiducial 205, using data specified in the machine configuration file, parses through the CAD file to locate data identifying fiducial locations. Fiducial found 210 determines if there was a fiducial in the file. If there was no fiducial found, report error 212 reports an error to the user and exits. If a fiducial was found, save fiducial data in element table 215 stores all relevant fiducial data into the element table. All fiducials found 220, using data specified in the machine configuration table, determines if there are more fiducials. If there are more fiducials, control is passed back to search for fiducials 205. If there are no more fiducials, then a search for emissive sites begins. Search for emissive site 225, using data specified in the machine configuration table, locates an emitter site. Save emissive site in element table 230, saves all relevant data of the emitter site to the element table. End of file reached 235, if false returns control back to search for emissive site 225, if true then there are no more emitter sites to extract from the CAD file. Close CAD file 240 closes the CAD file. Control is passed to design rule checker 140. Inspect element table entry 245, using data specified in the machine configuration table, verifies an element table entry. Element valid 250 determines if the element data was valid. There are elements/entries in the machine configuration file that will limit/constrain the placement and acceptable dimensions of pixels. The element table is checked to see if it specifies pixel placement and dimensions that are consistent with the configuration file. If the element data was not valid, report error 252 reports an error to the user and exits. If the element data is valid, there is a check to see if there are more elements to verify. All elements verified 255 determine if all elements in the element table have been verified. If there are more elements to verify, control is passed back to inspect element table entry 245. If all elements have been verified, close machine configuration file 260 closes the machine configuration file. Verified element table 265 contains a valid element table and is the output of this process, as well as part of the input into corrections module 150.

Figure 4:
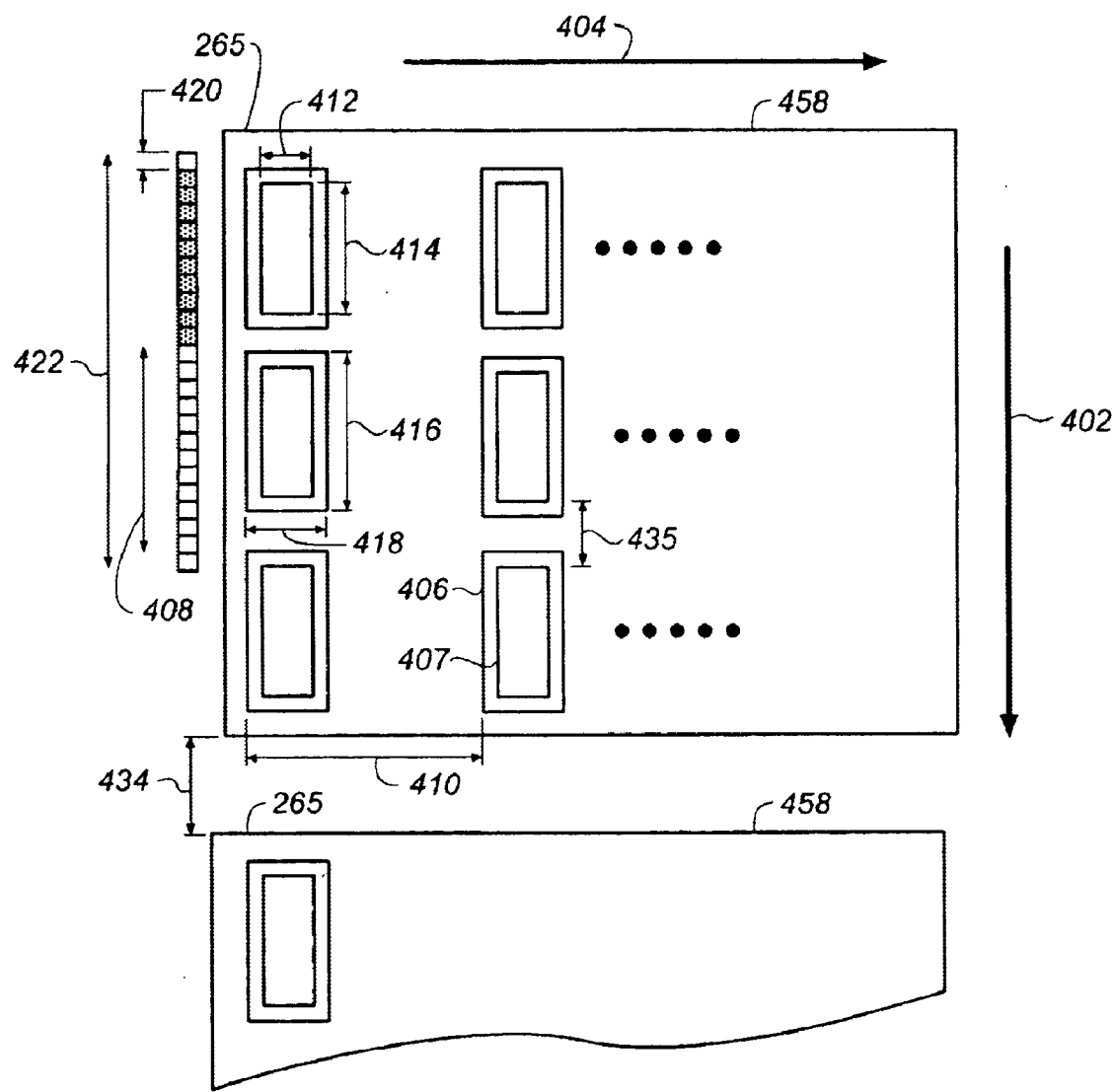
FIG. 4 shows a drawing of a section of a patterned substrate and indicates the physical representation of parameters used in subsequent processes.

Moving now to FIG. 4. FIG. 4 shows a drawing of a section of a patterned substrate and indicates the physical representation of various parameters used within the process of the corrections module 150. Orientation of this process is based upon two directions, slow scan 402 and fast scan 404. Hence one can describe the spacing from the top of one writing region 406 to the top of a second adjacent writing region 406 as slow pitch 408. Conversely, the spacing from one side of a writing region 406 to the same side of an adjacent writing region 406 would be expressed as fast pitch 410. Further, the writing region 406 is differentiated from pixel regions 407 as defined by pixel width 412 and pixel height 414 by an increase in these dimensions. The increase in these dimensions is governed by the control tolerance height 426 (not shown) and the control tolerance width 428 (not shown) which can be represented by constant values, mathematical functions or look up tables, which are formed, based upon the location within a substrate or various system parameters. Writing region is defined by writing region height 416 and writing region width 418. Channel height 420 refers to the dimension in the slow scan 402 of a single channel of the multichannel laser print head 165. The height 422 of print head 165 is defined as the height in the slow scan 402 direction of the totality of channel heights 420 for all channels of the multichannel print head 165, where this number is represented as N 424. The magnification correction factor 430 (not shown), a predetermined known error, represents the growth or shrinkage of the substrate in process relative to a fixed reference. Corrections for magnification correction factor 430 are applied by means of adjusting the coordinates of the color emissive sites to change their size and location to the parsed and design rule checked image data. The distortion function (x,y) 432 (not shown)), a predetermined known error, captures the amount and distribution of image warpage or deterministic errors which will be applied by means of adjusting the coordinates of the color emissive sites to change the size and location of the parsed and design rule checked image data. Distortion function(x,y) 432 includes arguments of height and width within a substrate. The spacing between writing region ends 458 (not shown) in the slow scan 402 direction on a substrate is described by the interdevice gap 434. The inter pixel gap 435 is the spacing between adjacent pixel regions 407.

During the execution of the corrections module 150, the following in process variables are utilized. The channel number within the multichannel print head 165 is described as Ci 436 (not shown) where i is the index for the print head 165, which ranges from 1 to N 424. Pixels and writing regions are referred to by the use of the index for pixel in the slow scan 402 direction, swaths 166 are referenced with swath pointer 442 (not shown) or k and columns are referenced with column pointer 443 (not shown), or 1. The algorithm computes the writing region start 456 (not shown) and writing region end 458 for each writing region 406 in the slow scan 402 direction. The algorithm computes various gaps, these include the top gap extension 444 (not shown), the remaining gap 447 (not shown) after the top gap extension has been subtracted from the Interpixel gap 435, the bottom gap extension 446 (not shown) is the extension of the written area beyond the bottom of the writing region 406, and the empty gap 448 (not shown) is the region between pixels which will not be exposed.

Figure 6:
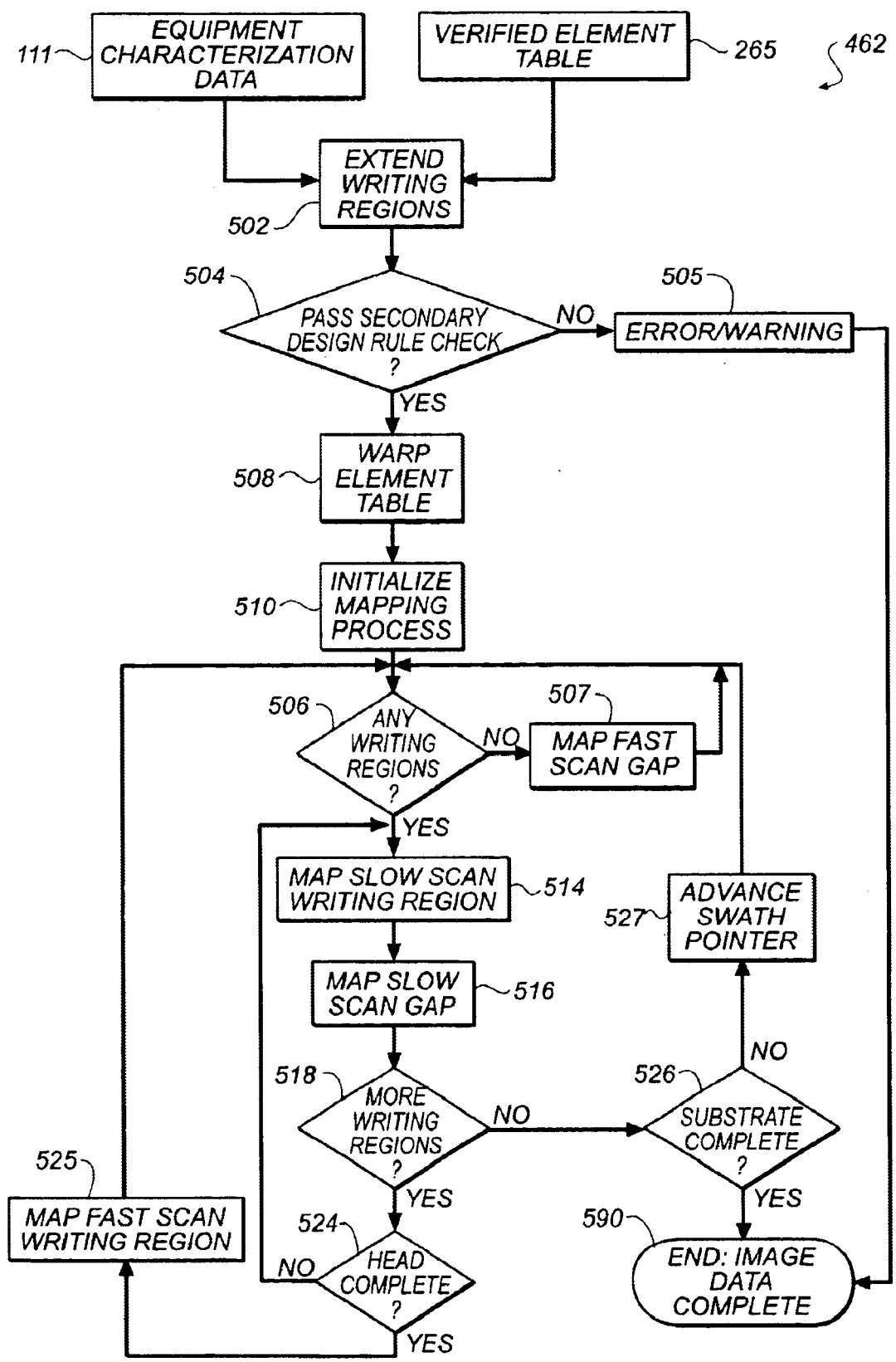
FIG. 6 shows a flow diagram of a method of applying correction data to the element table and converting the element table to machine control parameters.

The input to the corrections module 150 are the equipment characterization data 111, and a verified element table 265. The outputs of the corrections module 150 define the positions for actuating the printhead with respect to the alignment marks and the sequence for actuation of selected printhead laser beams and delivers pertinent errors and warnings 454 (not shown). The positions for actuating the printhead with respect to the alignment marks and the sequence for actuation of selected printhead laser beams are specifically captured within the swath advance table 450 and the head mapping table 452 (not shown) for each swath advance. All of these outputs may be referred to as image data 163. FIG. 6 shows the detailed steps of the corrections module 150.

The process begins with the action of extending the writing regions 502. Step 502 receives as input equipment characterization data 111, and a verified element table 265. Based upon known capabilities of the equipment provided by the equipment characterization data 111, the verified element table 265 entries are modified. Since the verified element table 265 entries refer to the coordinates of the color emissive sites, it is possible to adjust these verified element table 265 entries. Adjusting the verified element table 265 entries changes the coordinates of the color emissive sites and, thus, the size and location of the color emissive sites to compensate for these non-deterministic predetermined known errors. The region to which material is to be transferred is enlarged in the height and width such that known random variability will not result in a failure to transfer to the pixel region. These expansions for non-deterministic errors are defined by the following functions:

> writing region width 418=pixel width 412+control tolerance width 428; and

> writing region height 416=pixel height 414+control tolerance height 426.

The process then moves to the secondary design rule check 504. This step 504 involves two tests. First, the system verifies the channel height and slow pitch are compatible. Thus, determining that the size and location of the color emissive sites are compatible with the laser thermal transfer apparatus. Next, it verifies that application of the pre-defined warping functions will still yield compatibility between the channel height 420 and the slow pitch 408. This is necessary to ensure the ability to locate swath 166 boundaries within the inter pixel gap 435. Mathematically this is represented as:

> slow pitch−writing region height>channel height.

The system will generate an error 505 if the test is false, and proceed to end 590. If true, then the process will search for the maximum degree of distortion within the distortion function (x,y) 432, and will apply this to the slow pitch 408−writing region height 416. At this point, the process will again verify that this continues to satisfy the same test. If acceptable, the process will continue to step 508. If not, the process will determine the statistical likelihood of device failure per substrate and report a warning 505 for the slow scan mapping of the printhead 165 to this substrate pattern for production on this machine. In FIG. 6 the flow of control indicates that the process will end upon the issuance of a warning or an error. It should be obvious that it would be straightforward to intercede upon receipt of a warning and have an operator or a standard set of rules determine whether the process should actually proceed. In the case where the process does proceed, the process moves to warp element table 508.

In step 508, the process applies the distortion function (x,y) 432 to the table of all writing region start 456 and writing region end 458 and updates these locations in the verified element table 265. Control then moves to initialize swath map process 510.

In Step 510, two pointers are initialized to 1. These pointers include the channel index 438 (not shown) (also referred to as i) for the printhead 165, the pixel index 440 (not shown) or j, in the slow scan direction 402, and the swath pointer 442, or k. Hence the process begins at pixel index 440 not shown of 1, print head 165 channel index 438 of 1, and swath pointer 442 of 1. Next, the system equates the location of the top of the printhead 165 as described by the current channel index 438 with the location of the current writing region start 456 (writing region start$_j$) and store in the swath advance table 450 based upon swath pointer 442, k. The process then continues to check if there are any writing regions 506.

In step 506, the process refers to the warped element table using indices k and i. If the process detects a writing region at this index, it proceeds to step map slow scan writing region 514. If no writing regions exist at this index, the process proceeds to map fast scan gap 507.

In step 507, the process defines the distance by which the head can be advanced, and stores this into the image data. One should note that in cases where the patterning of the CAD file is not arranged in a striped pattern, a more sophisticated approach will be utilized to determine the fast scan gap. The process then advances the fast scan pointer and returns to step 506.

In step 514, the process computes the number of channels, which should be activated for WRS$_{j1}$. This step can be described mathematically by the following equation:

round up[((writing region start$_j$–writing region end$_j$)/channel height)]=q channels.

Step 514 continues whereby channels i 438 through i 438+q–1 will be activated in swath 166 k 442=1. This information is then stored in the head mapping table 452. Next, the channel pointer is updated to i 438=i 438+q, and the process moves to map gap 516.

In step 516, the process computes the bottom gap extension 446, the distance by which last channel will extend into the gap. This is represented by:

bottom gap extension=modulus((writing region start$_j$–writing region end$_j$))/channel height).

The process continues with the computation of the remaining gap, which can be represented by:

remaining gap=inter pixel gap–top gap extension.

Next, the process must determine the number of channels, which should be deactivated within the gap. This is done with the following function:

round down[(remaining gap/channel height)]=w channels.

Based upon this calculation, the channels from the current pointer through pointer+w–1 shall be deactivated as stored in the head mapping table 452. Next, the channel pointer will be updated, i=i+w. The process then moves to the step of checking to see if the end of the column of the CAD file has been reached. This step is called column complete 518.

In this step 518, the process checks whether additional writing region 406 exists in this column of the substrate. This is done by checking whether the max value of the index for pixel in the slow scan direction j 440 been reached. If it has been reached, then the slow scan mapping for this column of the substrate is complete, and the process proceeds to substrate complete 526. If the column of the substrate is not complete, the process moves to step 524.

In step 526, the process checks to see whether the entire substrate has been completed. This is done by checking whether the column counter max value has been reached. If the maximum value has been reached, then the substrate is complete, and the process moves to end 590. If the substrate is not complete, the process moves to advance to the next column in the element table 527.

In step 527, the process increments the column pointer 443 and returns to step 506.

In step 524, the process checks whether the max value of i has been reached. If it has been reached, then a new printhead 165 must be started by advancing the swath counter k 442 and reinitializing the channel counter i 438. The process then proceeds to map fast scan writing region 525. If the max value of I has not been reached, the process returns to step 514 to continue mapping the slow scan.

In step 525, the process defines the distance over which the head data must remain static. The process then stores this into the image data, advances the fast scan pointer, and proceeds to step 506.

It should be noted that an algorithm can be used to modify the distortion function (x,y) 432 such that the distribution of interdevice gap 434 and the slow pitch 408 of pixel regions 407 within a writing region end 458 will be studied and used to maximize the throughput of the system. An initial offset of the printhead 165 for the first swath 166 can be used to yield the minimum number of swaths 166. In addition, this algorithm can be used to distribute channel utilization uniformly during the printing of a substrate.

It should be noted that the above description will function in situations where the emissive site pattern occurs in a regular row and column arrangement of rectangular sites, and the distortion in the slow scan 402 direction is not dependent upon the position along the scan in the fast scan 404 direction. In this case, the process is fundamentally creating swath data in a run length encoded fashion. This approach will require less image data, but will enable less correction ability.

Real time fast scan error compensation can be incorporated into the printing process. This approach adds compensation for errors along the fast scan direction. These are tightly linked to the printing technique used. It is possible to extend the pixel regions 407 in the fast scan 404 direction and then apply the fast scan mapping as part of the printing process. This can be referred to as real time fast scan mapping process 462. In this process, the data sent to the printhead 165 is updated while the printhead 165 is traversing the media to be printed. The data is gated to the printhead 165 based upon metering information. A quantity has been defined as the line pitch 460 (not shown). This is the positional increment which, having been traversed, will trigger an update of data to the printhead 165. This line pitch 460 is modified on the fly by the pitch correction data 464 to generate the current line pitch 472 (not shown). This pitch correction data includes magnification correction factor 430.

In some cases, the image data 163 for the substrate and the necessary distortion will be such that the mapping in the fast scan direction needs to be done via an intensive algorithm. These cases would include situations where the pixel regions 407 are not located in repeatable row and column patterns, or when pixel regions 407 are not rectangular, or if the distortion necessary is a complex, non-linear function. In this situation, the head mapping will need to be performed prior to the imaging process.

Figure 5:
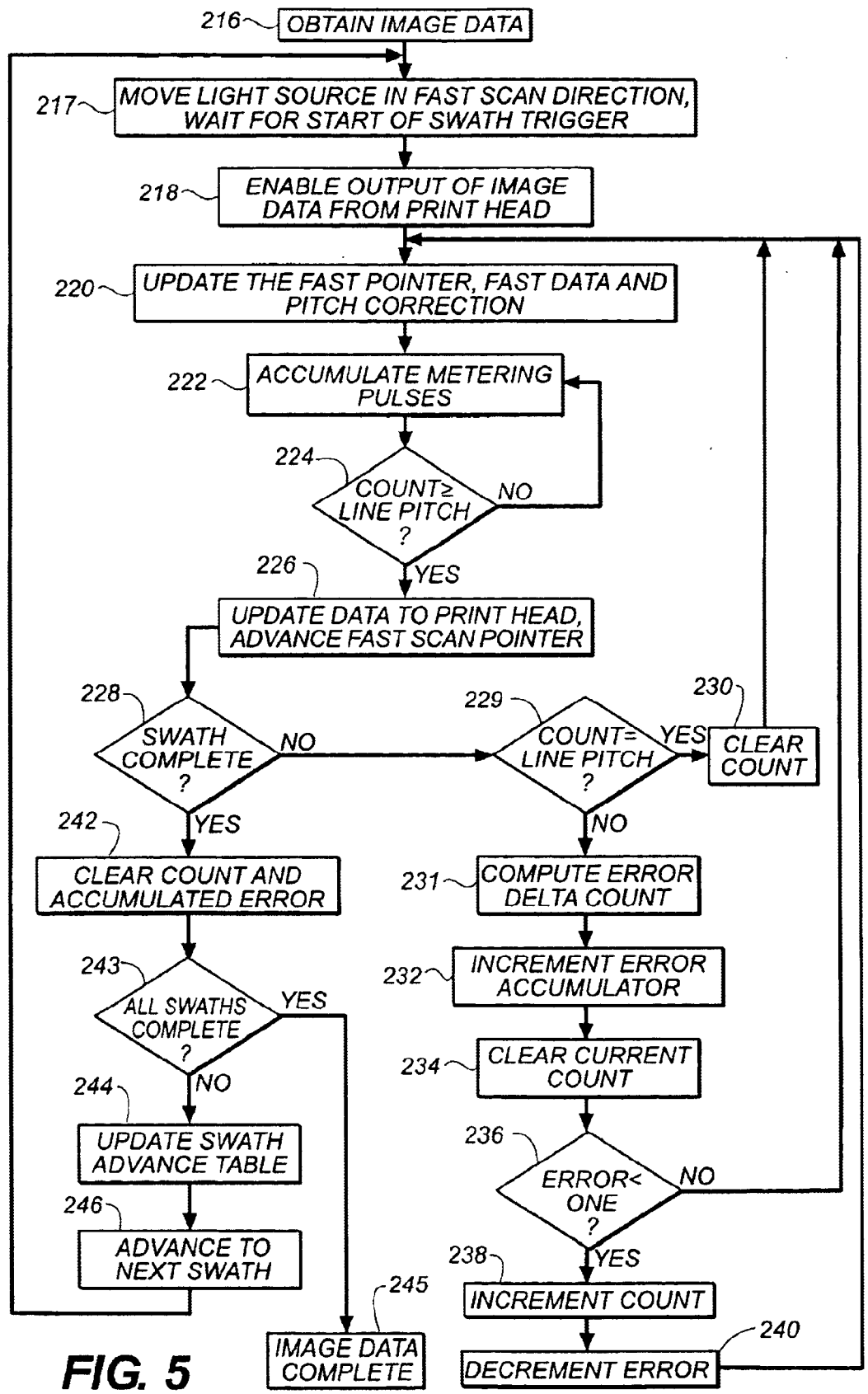
FIG. 5 shows a flow diagram of a method for transferring such machine control parameters to a laser thermal transfer apparatus.

The real time fast scan error compensation process 462 is illustrated in FIG. 5. This process includes several steps specifically related to the image data distortion as well as the metered printing process which has been described in detail within commonly assigned U.S. patent application Ser. No. 10/184,417 filed Jun. 27, 2002 by Andrea S. Rivers et al., entitled "Depositing an Emissive Layer for Use in an Organic Light-Emitting Display Device (OLED)", the disclosure of which is herein incorporated by reference. Commonly assigned U.S. patent application Ser. No. 10/184,417 covers the alignment of the printing process with the substrate in terms of lateral and angular offsets, as well as compensating for thermal expansion of the substrate by modification of the line pitch 460 with a constant magnification correction factor 430. In this case, the modifications to the line pitch will include all sources of distortion.

FIG. 5 illustrates the real time fast scan error compensation process 462. The fast scan 404 real time fast scan error compensation process 462 begins with step 216, where the image data 163 is accessed by the system controller 161. Image data 163 can include printhead 165 actuation data 470, pitch correction data 464, and swath advance data 466 from the swath advance table 450, and other machine control parameters. Process 462 then moves to step 218, where the printhead is moved to the position identified by the swath advance data 466, and the start of swath trigger 468 is generated. Upon receipt of the start of swath trigger 468, the system controller 161 executes step 219, where it gates the printhead 165 actuation data 470 to the printhead 165. The process 462 moves to step 220, where the system controller 161 accesses the next set of actuation data 470, and the pitch correction data 464 for the current location within the image data 163. Moving to step 222, the system controller 161 accumulates metering pulses from the motion control system 167. Step 224 includes a continuous monitoring and comparison of the metered pulse relative to the current line pitch 472. The current line pitch is the line pitch 460 modified by the pitch correction data 464. In step 224, when the accumulated metering data is greater than or equal to the current line pitch 472, the process 462 moves to step 226. In step 226, the system controller 161 gates the next set of actuation data 470 to the printhead 165, and advances the fast scan pointer 476 (not shown). The process then moves to step 228, which established whether the swath has been completed. If the swath has been completed, the registers are cleared in step 242, and the process moves to step 243. In step 243, the system controller 161 checks whether additional swaths exist in the image data 163. If more swaths exist, the process continues to step 246, where the system controller 161 updates the swath advance table pointer 474 (not shown). Next, the process moves on to step 244, where the system advances to the next swath location based upon swath advance data 466, and the process returns to step 218 to execute the writing of the next swath. If, in step 228, the swath is not complete, the process 462 moves to step 229. In step 229, the system controller determines whether the accumulated metering pulse count is exactly equivalent to the current line pitch 472. If they are equivalent, the process moves to step 230, where the accumulated count is cleared and the process returns to step 220. If the accumulated count and the current line pitch 472 differ, the difference is computed in step 231. This difference is added to the error accumulator in step 232, and the accumulated count is cleared in step 234. The process 462 then moves to step 236, where the error accumulator is tested to determine if the accumulated error is greater then one metering unit. If the accumulated error is greater than one metering unit, the process moves to step 238 where the integer portion of the accumulated error is added to the pitch correction factor at the current fast scan pointer 476. In step 240, the integer portion of the accumulated error is decremented from the accumulated error, and process returns to step 220.

It should be noted that other corrections will be needed and that, with modification, such a printing algorithm can accommodate the necessary correction factors. A given substrate can contain errors in placement of pixel portions due to upstream process variability. These can be continuously varying errors such as magnification, or a distortion due to optical exposure, or the physical warping of a component. If the upstream process is a step and repeat process, the errors may not be continuous. Further, errors can exist within the printer itself, which may or may not be of a continuous nature. Continuous variations will result from sources such as the distortion of the laser beam due to the deflection of the chamber window, or pointing errors of the multichannel laser printhead 165 due to the straightness of the supporting beam. Discontinuous changes can also exist due to defects within the motion feedback elements or the motion and supporting mechanism. Utilization of variable pitch correction can accommodate all of these errors. Variable pitch correction can utilize a table of corrections or a mathematical relationship with or without discontinuities to accommodate the broader requirement.

In order to effect correction for some errors, the image resolution may need to increase in some regions, while being lower in other areas. There can be a limitation around the use of complex mathematical relationships during the printing of devices at high speed. Hence, it is possible to apply the corrections within the RIP and utilize a high-speed correction, such as a fixed pitch correction or a more simple function. The decision as to how to divide the functionality would depend upon the complexity of the variability in the process. Effort would be placed upon minimizing image manipulation in response to normal process variability. Responding to detected process changes such as vacuum chamber pressure would be best accommodated by corrections on the fly.

The process defined by the quality inspection module 170 involves characterizing errors by using the laser thermal transfer apparatus to form the color emissive sites onto the OLED substrate, and determining the predetermined known errors caused by such laser thermal transfer apparatus. Quality inspection module 170 develops an error map, which relates the misregistration of written pixel regions with the preexisting patterned regions on the substrate. This must be expressed in 2D. An imaging system and a precision transport mechanism can be used to locate the written regions and pre-existing patterned regions across all regions of the substrate. The positional feedback mechanism of the precision transport mechanism would be used to define actual locations along the substrate. This can include precision optical encoders or laser interferometers. Image processing software can generate the error data. Analysis of this error data would result in a quantification of the deterministic and non-deterministic errors associated with the process, caused by the laser thermal transfer apparatus. These predetermined known errors are utilized by corrections module 150. For example, a system could be comprised of a motion platform similar to systems built by Dover Instruments and Optical Gauging Products. Imaging systems include, for example, an Olympus Provis Research microscope equipped with fluorescent light at wavelengths of 365 and 470 nm, and an instrumented stage with controlling hardware and software, as well as image processing software. Such image processing software can be obtained from Media Cybernetix, for example, Image Pro software and Stage Pro software.

The present invention is a system for and a method of transferring computer-assisted design (CAD) files to a laser thermal transfer (LTT) system for printing an image or deposition pattern. The method of the present invention includes various system steps in which data contained in CAD files is converted into a set of instructions for the deposition of organic medium upon a substrate which has fiducials in order to subsequently form an organic light-emitting diode (OLED) display producing an image data to be used by a laser thermal transfer apparatus having a multiple channel printhead of laser beams for transferring different organic material with dopants from a donor onto an OLED substrate to form different color emissive sites on the substrate.

The invention has been described in detail with particular reference to certain preferred embodiments thereof, but it will be understood that variations and modifications can be effected within the spirit and scope of the invention.

Parts List

- 100 LTT station
- 101 LTT station
- 110 input data module
- 111 equipment characterization data
- 120 raster image processor
- 130 parser
- 140 design rule checker
- 150 corrections module
- 152 corrections data
- 155 image corrections module
- 157 output data module
- 160 laser thermal transfer apparatus
- 161 system controller
- 163 image data
- 165 multichannel laser printhead
- 166 swath
- 167 motion control system
- 169 device
- 170 quality inspection module
- 171 real time quality inspection module
- 173 offline quality inspection module
- 200 initialization
- 205 step
- 210 step
- 212 step
- 215 step
- 216 step
- 217 step
- 218 step
- 220 step
- 222 step
- 224 step
- 225 step
- 226 step
- 228 step
- 229 step
- 230 step
- 231 step
- 232 step
- 234 step
- 235 step
- 236 step
- 238 step
- 240 step
- 242 step
- 243 step
- 244 step
- 245 step
- 246 step
- 250 element valid
- 252 report error
- 255 all elements verified
- 260 close machine configuration file
- 265 verified element table
- 402 slow scan
- 404 fast scan
- 406 writing region
- 407 pixel regions
- 408 slow pitch
- 410 fast pitch
- 412 pixel width
- 414 pixel height
- 416 writing region height
- 418 writing region width
- 420 channel height
- 422 height
- 426 control tolerance height
- 428 control tolerance width
- 430 magnification correction factor
- 432 distortion function (x,y)
- 434 interdevice gap
- 435 inter pixel gap
- 436 Ci
- 438 channel index
- 440 pixel index
- 440 pointer
- 443 column pointer
- 444 top gap extension
- 446 bottom gap extension
- 447 remaining gap
- 448 empty gap
- 450 swath advance table
- 452 head mapping table
- 454 errors and warnings
- 456 writing region start
- 458 writing region end
- 460 line pitch
- 462 real time fast scan error compensation process
- 464 pitch correction data
- 466 swath advance data
- 468 swath trigger
- 470 actuation data
- 472 current line pitch
- 474 swath advance table pointer
- 476 fast scan pointer
- 502 extending the writing regions
- 504 secondary design rule check
- 505 error or warning
- 506 writing regions
- 507 map fast scan gap

508 warp element table
510 initialize swath map process
514 map slow scan writing region
516 map gap
518 column complete
524 step
525 map fast scan writing region
526 substrate complete
527 advance swath pointer
528 element table
590 proceed to end

What is claimed is:

1. A method for producing an image data to be used by a laser thermal transfer apparatus having a multiple channel printhead of laser beams for transferring different organic material with dopants from a donor onto an OLED substrate to form different color emissive sites on the substrate comprising:

a) receiving a graphical representation of the layout of the color emissive sites and alignment marks formed on the OLED substrate;

b) responding to such graphical representation and position of alignment marks to form coordinates to define the size and location of the color emissive sites on the OLED substrate relative to the alignment marks;

c) adjusting the coordinates of the color emissive sites to change the size and location of the color emissive sites to compensate for predetermined known errors that will be caused by the laser thermal transfer apparatus; and d) producing the image data to be used by the laser thermal transfer apparatus that includes positions for actuating the printhead with respect to the alignment marks and the sequence for actuation of selected printhead laser beams.

2. The method of claim 1 further including determining if the size and location of the color emissive sites are compatible with the laser thermal transfer apparatus.

3. The method of claim 1 wherein the laser thermal transfer apparatus printhead is adapted to scan the printhead laser beams across the surface of the donor.

4. The method of claim 1 further including characterizing errors by using the laser thermal transfer apparatus to form the color emissive sites onto the OLED substrate and determining the predetermined known errors caused by such laser thermal transfer apparatus.

* * * * *